United States Patent

Robinett

[11] Patent Number: 5,964,980
[45] Date of Patent: Oct. 12, 1999

[54] FITTED ENDPOINT SYSTEM

[75] Inventor: Christopher T. Robinett, San Antonio, Tex.

[73] Assignee: VLSI Technology, Inc., San Jose, Calif.

[21] Appl. No.: 09/103,624

[22] Filed: Jun. 23, 1998

[51] Int. Cl.[6] .............................................. H01L 21/306
[52] U.S. Cl. ......................................................... 156/345
[58] Field of Search ................................ 216/60; 438/9; 204/298.32; 156/345

[56] References Cited

U.S. PATENT DOCUMENTS

| | | | |
|---|---|---|---|
| 4,479,848 | 10/1984 | Otsubo et al. | 156/626 |
| 5,160,402 | 11/1992 | Cheng | 156/627 |
| 5,467,883 | 11/1995 | Frye et al. | 216/60 |

Primary Examiner—Bruce Breneman
Assistant Examiner—Rudy Zervignon
Attorney, Agent, or Firm—Patrick T. King

[57] ABSTRACT

A processor is provided for an improved semiconductor etching system which generates a series of multi-bit digital output code words. The processor provides an endpoint detector for determining if one of the digital output code word has reached a predetermined endpoint level and for generating a control signal to stop etching of a wafer. The processor further provides a standard endpoint curve corresponding to standard etching of a standard wafer. A normalizer is provided for normalizing the current endpoint curve generated from the series of multi-bit digital code words for a wafer being etched with respect to the standard endpoint curve and for providing a normalized current endpoint curve. A comparator fits and compares the normalized current endpoint curve for a wafer being etched to the standard endpoint curve, where the comparator includes a generator for generating a quality index number for the wafer corresponding to the cumulative area between the normalized current endpoint curve for a wafer being etched and the standard endpoint curve.

6 Claims, 4 Drawing Sheets

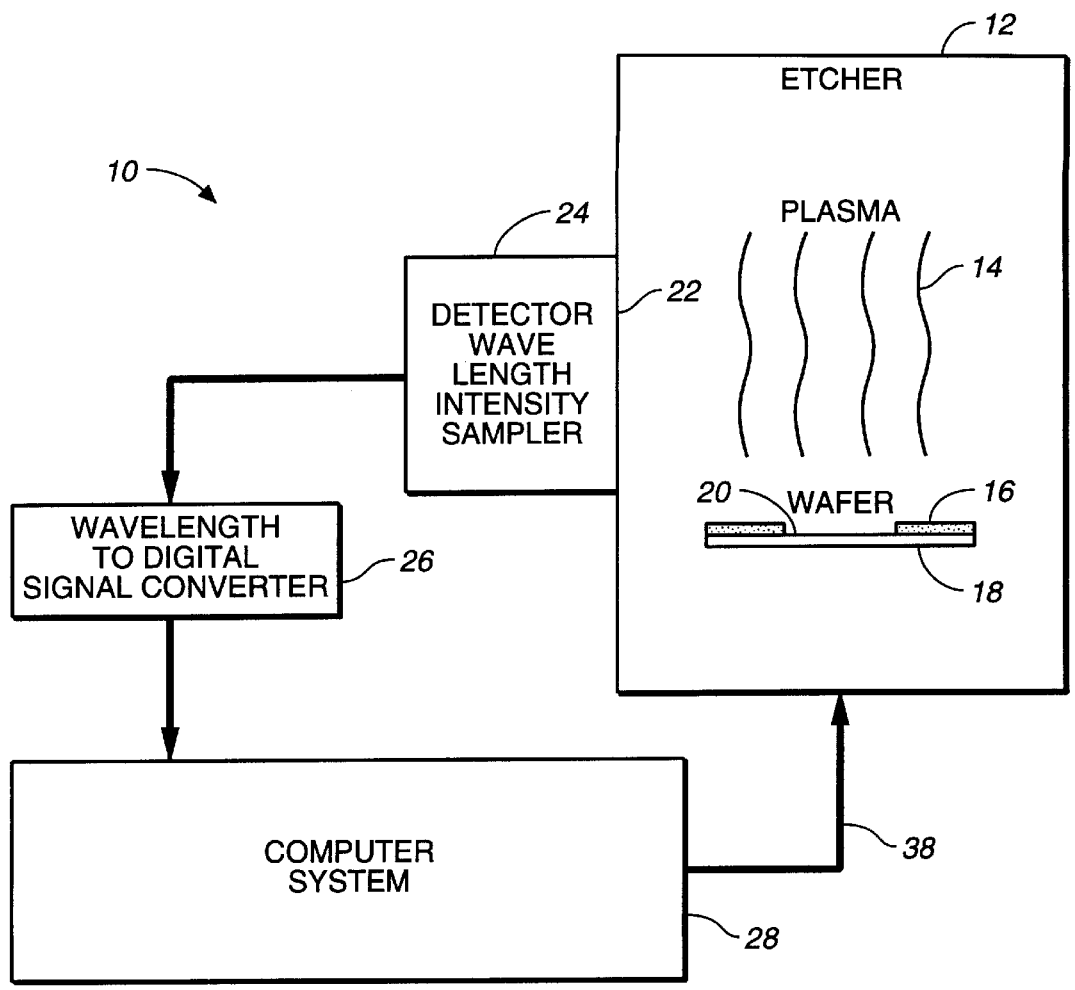
FIG._1
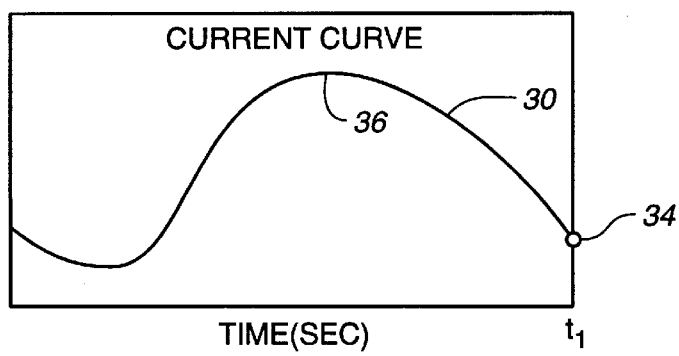
FIG._2

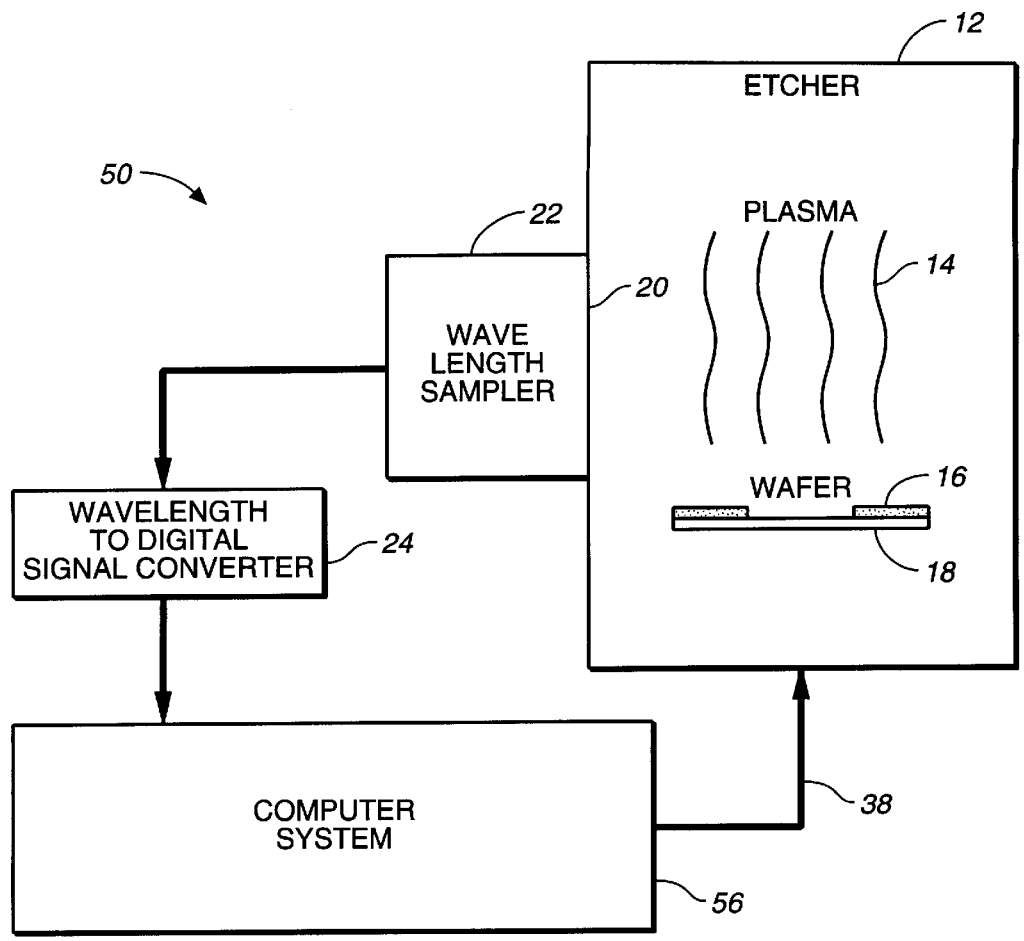
FIG._3
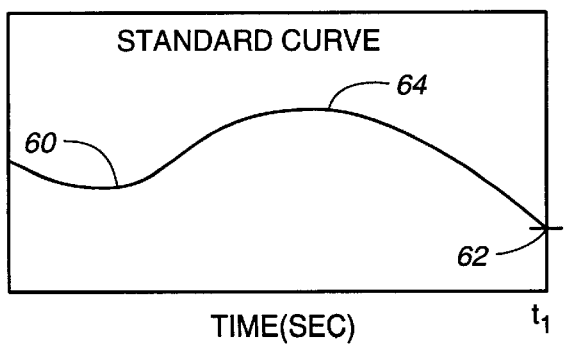
FIG._4
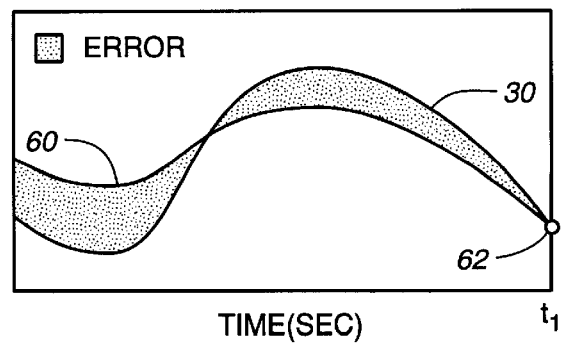
FIG._5

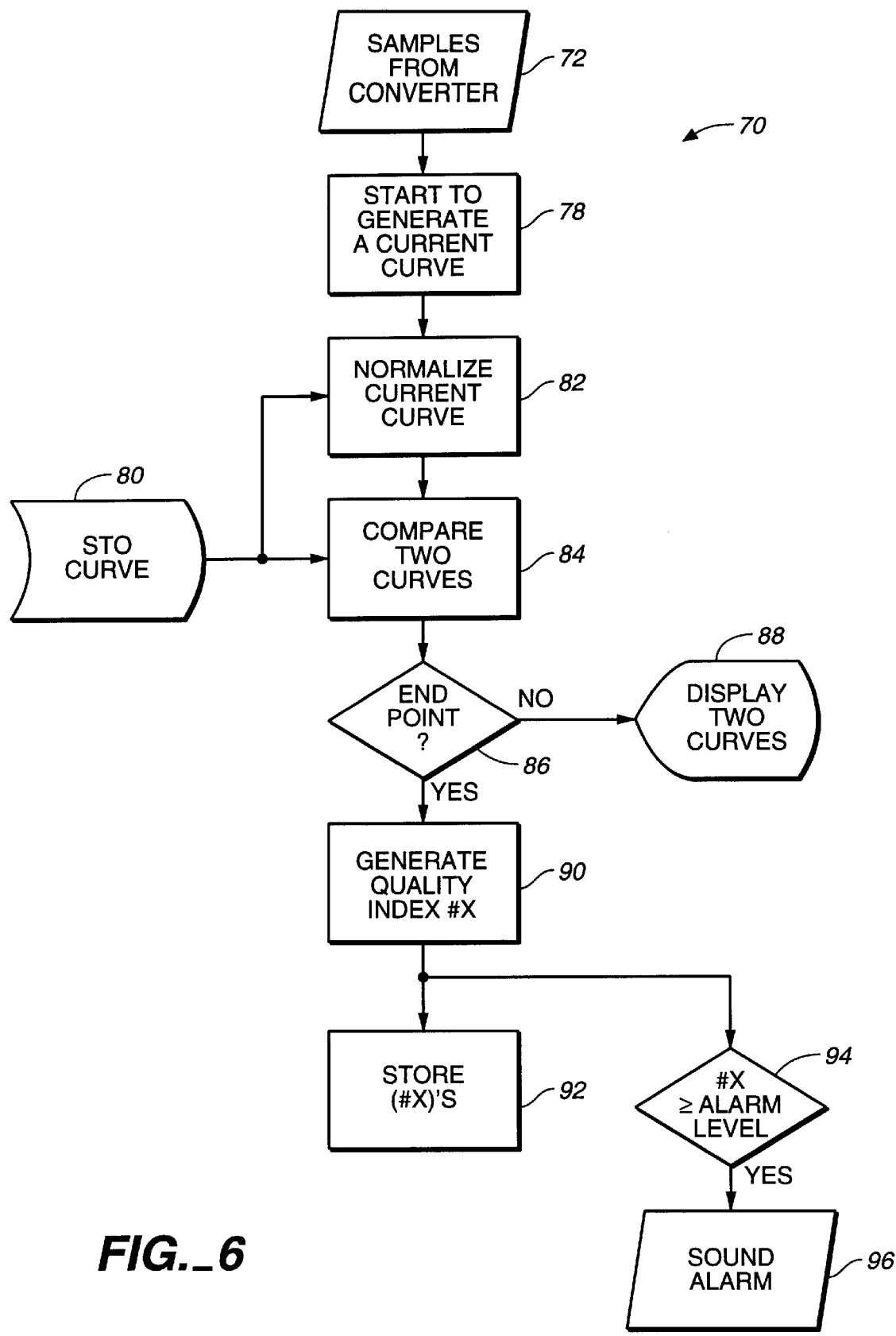
FIG._6

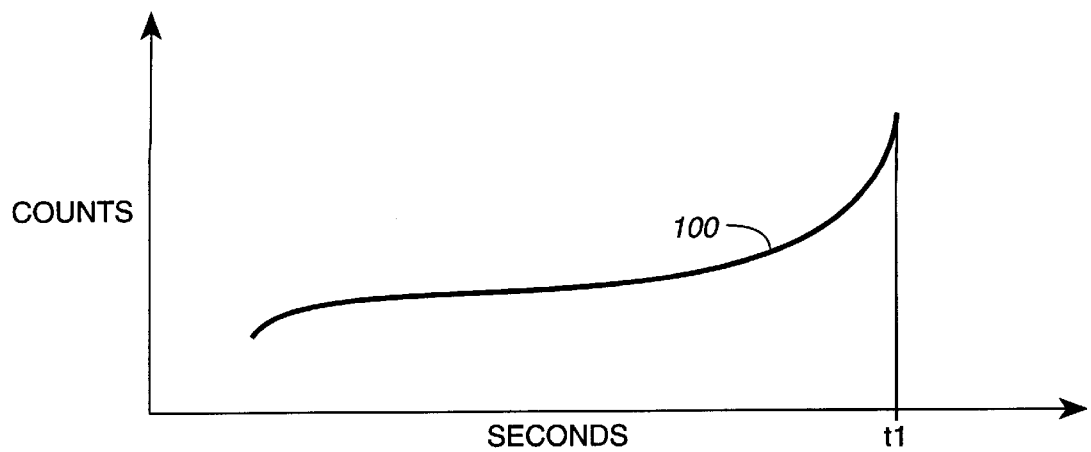
FIG._7
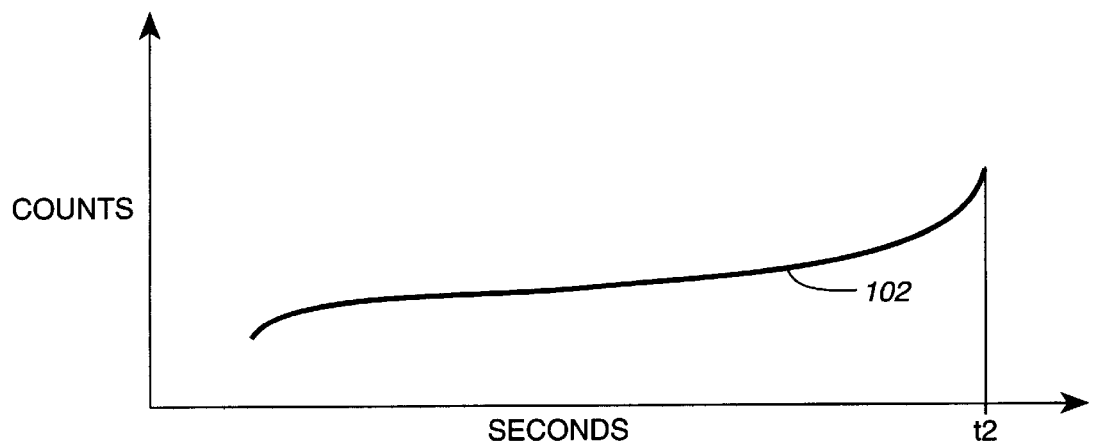
FIG._8
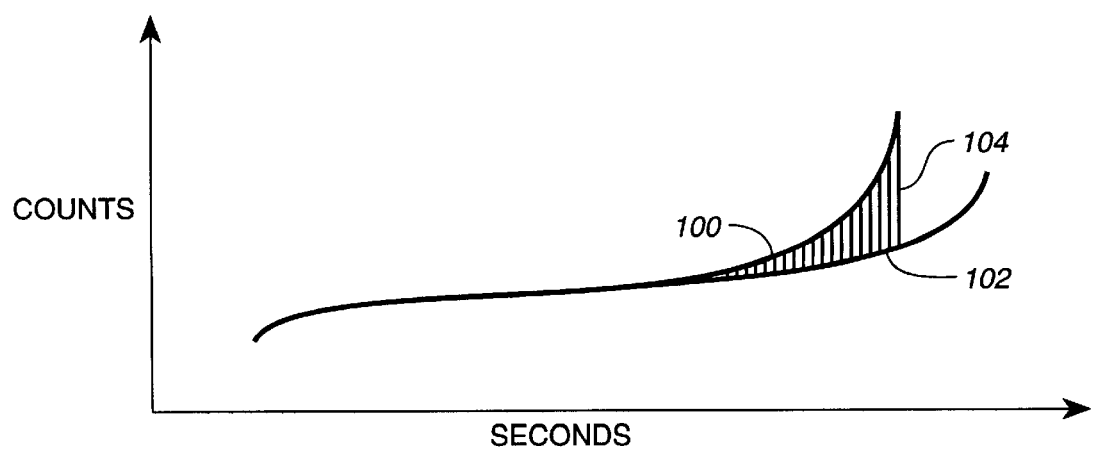
FIG._9

FITTED ENDPOINT SYSTEM

BACKGROUND OF THE INVENTION

1. Field of the Invention.

This invention relates to semiconductor processing equipment and, more particularly, to systems and methods for determining if a plasma etching process is out of tolerance.

2. Prior Art.

Plasma etchers are used in semiconductor processing to avoid undercutting of a layer being etched and provide straight vertical edges. An important step in a plasma etching process is stopping of the etching process after the layer being etched has been removed but before the next layer is removed. Determination of the point at which to stop further etching is called "endpoint detection." Etching beyond the endpoint may cause unwanted removal of desired portions of the next layer, such as, for example, thin gate oxides. As the device geometries of semiconductor devices continue to decrease in size, the need for more accurate endpoint detection increases.

Etching a particular layer on a semiconductor wafer with a RF plasma generates light energy at a particular wavelength where that wavelength corresponds to the material being etched. An optical sensor is used to monitor the intensity of the light energy at that particular wavelength corresponding to the material being etched. An endpoint is determined to have been reached when the optical sensor indicates that the light energy at the particular wavelength has fallen below a specific level. An endpoint signal is then generated to stop etching of the particular layer on the semiconductor wafer.

FIG. 1 diagrammatically shows a semiconductor etching system 10 which uses a conventional endpoint detection technique. An etching chamber 12 contains a RF plasma 14 which is generated therein for etching away selected unmasked portions of a film layer 16 previously formed on a wafer 18 contained within the chamber 12. The plasma etching process typically removes selected unmasked portions of the film layer 16 to expose an underlying layer 20, such as, for example, a portion of the top surface of the wafer 18 or another layer formed on the wafer.

As previously mentioned, etching away selected portions of a particular layer on a semiconductor wafer with a RF plasma generates light energy at a particular wavelength which corresponds to the specific material being etched. Different etched materials generate different wavelengths. In order to view the particular wavelength, the etching chamber 12 also includes a window 22 through which an optical detector of a detector and wavelength sampler unit 24 views the RF plasma 14 in the chamber 12. The optical sensor, or detector, is used to monitor the intensity of light energy at a particular wavelength corresponding to the particular material being etched away from the unmasked top surface of the wafer 18 in the etching chamber 12. The optical sensor provides a continuous intensity signal corresponding to the intensity of the light energy at the particular wavelength for the material being etched from the unmasked top surface of the wafer 18. A wavelength intensity sampler periodically samples the continuous intensity signal and provides a series of stepped sample signals to a wavelength-intensity-to-digital signal converter 26, which provides a periodic series multi-bit digital output code word, or counts, corresponding to each wavelength sample. A count is taken at intervals ranging, for example, from one-half to one second.

The counts, or multi-bit digital output code words, of the wavelength-to-digital converter 26 are then processed by software in a computer system 28. The computer system 28 processes the multi-bit digital output code words to determine an endpoint signal.

FIG. 2 illustrates that the envelope of the counts, or digital output signals, from the converter 26 which are processed by the computer 28 can be visualized in a graphic form as a curve 30 of counts vs. time. The typical endpoint curve 30 of FIG. 2 is for an etched material which has a characteristic wavelength which decreases in intensity as the material is etched away. This curve 30 can be displayed on a display screen. An endpoint level 34 is set as a predetermined percentage drop from a peak, or maximum, count 36. A typical predetermined percentage is 90 per cent. When the selected portions of the film layer 16 are removed, the intensity at the selected wavelength decreases. When the light energy at the particular wavelength corresponding to the material being etched has fallen below the endpoint level 34, an endpoint signal is generated and sent on a signal line 38 from an output terminal of the computer system 28 to an input terminal of the etching chamber 12. The endpoint signal stops etching of the particular layer on the semiconductor wafer.

FIG. 2 illustrates that the time at which the endpoint level 34 is reached occurs at a time $t_1$. If the endpoint signal is weak, the endpoint time is extended and results in over-etching of a wafer.

Current endpoint systems only evaluate percentage changes from a preset mean or average reference point so that problems with an etching process are not immediately identified.

SUMMARY OF THE INVENTION

It is therefore an object of the invention to provide a fitted endpoint system which immediately identifies problems with a plasma etching system.

A fitted endpoint system according to the invention uses a curve formed from a series of sample pulses to determine variations from a standardized curve to obtain a fitted error value. The fitted error value is obtained by normalizing the curves and taking their ratio. Deviation between the two curves results in a fitted error which identifies changes in the plasma, film, or equipment while wafers are being processed.

An improved semiconductor etching system is provided which includes a plasma etching chamber adapted to contain a RF plasma for etching selected portions of a predetermined selected layer of material formed on a semiconductor wafer. The plasma etching chamber has a window formed therein for viewing light energy at a particular wavelength generated during the etching of selected portions of a predetermined selected layer of material formed on a semiconductor wafer, where the particular wavelength corresponds to the selected layer of material formed on a semiconductor wafer. A detector detects and monitors the intensity of the particular wavelength generated during the etching of selected portions of the predetermined selected layer of material formed on the semiconductor wafer, said detector providing an output signal proportional to the intensity of the particular wavelength. A wavelength sampler periodically samples the output signal of said detector to provide a series of stepped output sample pulses. An A/D converter converts the series of stepped output sample pulses to a series of multi-bit digital output code words, where each of the code words corresponds to one of the stepped output sample pulses.

The system includes a processor having an input terminal for receiving the series of multi-bit digital output code words. The processor provides an endpoint detector for determining if one of the digital output code words has reached a predetermined endpoint level and for generating a control signal to stop etching of a wafer. The processor also provides a standard curve generator for generating a standard endpoint curve corresponding to standard etching of a standard wafer. A normalizer is provided for normalizing the current endpoint curve generated from the series of multi-bit digital code words for a wafer being etched with respect to the standard endpoint curve and for providing a normalized current endpoint curve. The processor includes a comparator for fitting and comparing the normalized current endpoint curve for a wafer being etched to the standard endpoint curve, where the comparator includes a generator for generating a quality index number for the wafer corresponding to the cumulative area between the normalized current endpoint curve for a wafer being etched and the standard endpoint curve.

A store is provided for a plurality of quality index number, wherein each of said plurality of index numbers is associated with a previously etched wafer. An alarm is triggered when a quality index number exceeds a predetermined value.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a schematic diagram of a conventional semiconductor etching system having a conventional endpoint detection system which etches a material having a decreasing intensity of a characteristic wavelength.

FIG. 2 is a graph of a typical endpoint curve from a conventional endpoint detection system which etches a material with a characteristic wavelength having a decreasing intensity.

FIG. 3 is a schematic diagram of a semiconductor etching system which uses a fitted endpoint detection system according to the invention.

FIG. 4 is a graph of a standard endpoint curve for a fitted endpoint detection system which etches a material having a characteristic wavelength with a decreasing intensity.

FIG. 5 is a graph showing fitted error areas obtained by superimposing the typical endpoint curve of FIG. 2 on the standard endpoint curve of FIG. 4 for a fitted endpoint detection system which etches a material having a characteristic wavelength with a decreasing intensity.

FIG. 6 is a flowchart illustrating generation of a quality index for a wafer being etched.

FIG. 7 is a graph of a standard endpoint curve for a fitted endpoint detection system which etches a material having a characteristic wavelength with an increasing intensity.

FIG. 8 is a graph of a typical endpoint curve from a conventional endpoint detection system which etches a material with a characteristic wavelength having a decreasing intensity.

FIG. 9 is a graph showing fitted error lines obtained by superimposing the typical endpoint curve of FIG. 7 on the standard endpoint curve of FIG. 8 for a fitted endpoint detection system which etches a material having a characteristic wavelength with an increasing intensity.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 3 is a schematic diagram of a semiconductor etching system 50 which uses a fitted endpoint detection system according to the invention. FIG. 3 uses the same reference numerals that are used with FIG. 1 for like elements. The etching chamber 12 contains the RF plasma 14 which is generated therein for etching away selected unmasked portions of the film layer 16 previously formed on the wafer 18 contained within the chamber 12. The plasma etching process typically removes selected unmasked portions of the film layer 16 to expose an underlying layer 20, such as, for example, a portion of the top surface of the wafer 18 or another layer formed on the wafer.

Etching away selected portions of a particular layer on a semiconductor wafer with the RF plasma generates light energy at a particular wavelength, where the particular wavelength corresponds to the specific material being etched and where different etched materials generate different wavelengths. The etching chamber 12 also includes a window 20 through which an optical detector of a detector and wavelength sampler unit 22 views the RF plasma 14 in the chamber 12. The optical sensor, or detector, is used to monitor the intensity of the light energy at a particular wavelength corresponding to the particular material being etched away from the unmasked top surface of the wafer 18 in the etching chamber 12. The optical sensor provides a continuous intensity signal corresponding to the intensity of the light energy at the particular wavelength corresponding to the particular material being etched from the unmasked top surface of the wafer 18.

A wavelength-intensity sampler of the detector and wavelength intensity sampler unit 24 periodically samples the continuous intensity signal and provides a series of stepped intensity sample signals to a wavelength-intensity-to-digital signal converter 26. The signal converter 26 periodically provides a multi-bit digital output code word for each sample signal from the detector and wavelength sampler unit 24. The values of the digital output code words, called "counts," are proportional to the values of the intensity sample signals. A count is periodically taken at fixed intervals which range, for example, from one-half to one second.

The digital output code words, or counts, of the wavelength-to-digital converter 26 are then processed by software in the computer system 56, as typically illustrated with the flow chart shown in FIG. 6 herein below, The output signals of the converter 26 are also the same as illustrated in FIG. 2, where FIG. 2 shows a graph of a typical endpoint curve from the endpoint detection system which etches a material with a characteristic wavelength having a decreasing intensity as the etching nears completion. The endpoint 34 is set as a predetermined percentage drop from a peak, or maximum, count level 36, where the typical predetermined percentage is 90 per cent. When the light energy at the particular wavelength corresponding to the material being etched has fallen to the endpoint level 34, the endpoint signal is then generated and sent on the signal line 38 to the input terminal of the etching chamber 12 to stop etching of the particular layer on the semiconductor wafer 18. The time at which the endpoint level 34 is reached occurs at a time tl. If the endpoint signal is weak, the endpoint time is extended and results in over-etching of a wafer.

FIG. 4 is a graph of a standard endpoint curve 60 which plots counts versus time for a standard endpoint curve for a fitted endpoint detection system which etches a material having a characteristic wavelength with a decreasing intensity as the etching nears completion. The endpoint 62 is set at a predetermined percentage drop from a peak value 64. The computer system 56 is provided with the standard endpoint curve 60 of FIG. 4. The endpoint curve 30 is normalized and compared to the standard endpoint curve 60 of FIG. 4.

FIG. 5 illustrates that the computer system 56 of FIG. 3 superimposes a normalized graph 30 of FIG. 2 on the standard endpoint curve of FIG. 4. The areas between the curves indicate the differences between the curves 30, 60. The areas between the two curves are computed and a quality number from 0 to 1 is produced. A quality number of 1 equals a best or perfect fit. The standard deviation of these quality numbers are monitored. A wafer which has a quality number which has a significant deviation from the mean of previous wafers indicates that some process variable has changed and triggers a warning to an operator. The changed process variable includes variation in the thickness of the film being etched, a gas leak, or reduced gas pressure.

Current endpoint systems only evaluate a percent change from a mean or average reference endpoint. If a fitted endpoint is used according to the invention, the entire curve 30 is utilized to determine variations by comparing the entire curve 30 to the standard curve 60. The conventional endpoint of a signal is also utilized from the curve (spectrum). The unique curve 30 of each wafer is compared to a standard endpoint curve 60. The standard curve is always the reference curve for each endpoint curve. The deviations between the two spectrums or curves results in a fitted error. The fitted error identifies changes in the plasma, film, or equipment while the wafers are being processed.

Today's endpoint system only identifies problems after the problems have occurred. When a failed endpoint alarm sounds, this usually results in a scrapped wafer. A fitted endpoint system according to the invention identifies problems as soon as they occur. The fitted error value is obtained by normalizing the two curves and then taking the ratio of the two curves.

FIG. 6 is a flowchart 70 illustrating the functions performed by the computer 56. The wavelength-intensity sampler of the detector and wavelength intensity sampler unit 24 periodically samples the continuous intensity signal and provides a series of stepped intensity sample signals to the wavelength-intensity-to-digital signal converter 26. As illustrated with Block 72, the signal converter 26 periodically provides sample information in the form of a multi-bit digital output code word for each sample signal from the detector and wavelength sampler unit 24 where the values of the digital output code words, called "counts," are proportional to the intensity sample signals. The counts are periodically taken at fixed intervals which range, for example, from one-half to one second.

Block 78 indicates that the sample information is used to mathematically generate a "current curve" for a current wafer being etched. Block 80 indicates that a mathematical representation of a standard curve for the particular type of layer being etched is stored in the computer. In Block 82, the current curve is normalized with respect to the standard curve. In Block 84 the normalized current curve and the standard curve are compared. Blocks 86 and 88 indicate that, if an endpoint is not reached, the two curves are displayed together including an updated sample value.

If the endpoint is reached, Block 90 shows that a quality index number #X for the wafer being etched is generated. The quality index #X is, for example, a number from 0 to 1 and represents the areas between the curves, as illustrated in FIG. 5, where the quality number of 1 equals a best or perfect fit. The areas between the two curves are computed and a quality number from 0 to 1 is produced. Block 92 shows that the quality numbers for each wafer is stored for future reference and comparisons of the various wafers previously processed. Block 94 tests whether a quality number for a particular wafer has exceeds a predetermined limit and Block 96 sounds an alarm to immediately notify an operator to immediately investigate whether a process variable has changed, such as, for example, a variation in the thickness of the film being etched, a gas leak, or reduced gas pressure, etc. If a fitted endpoint system is used according to the invention, the entire current curve 30 is utilized for comparison with the standard curve 60.

FIG. 7 shows a standard endpoint curve 100 for a fitted endpoint detection system which etches a material having a characteristic wavelength with an increasing intensity. FIG. 8 shows a typical endpoint curve 102 obtained from a conventional endpoint detection system which etches a material with a characteristic wavelength having a decreasing intensity. Both of the curves 100, 102 are processed by the computer system 56. FIG. 9 shows fitted error lines 104 obtained by superimposing the typical endpoint curve 102 of FIG. 8 on the standard endpoint curve 100 of FIG. 6 to provide a fitted endpoint detection system which etches a material having a characteristic wavelength with an increasing intensity. The fitted error lines are used to provide a quality index for a wafer which ranges from 0 to 1. A quality number of 1 equals a best or perfect fit. The standard deviation of these quality numbers are monitored. A wafer which has a quality number which has a significant deviation from the mean of previous wafers indicates that some process variable has changed and triggers a warning to an operator. The changed process variable includes variation in the thickness of the film being etched, a gas leak, or reduced gas pressure.

Current endpoint systems only evaluate a percent change from a mean or average reference endpoint. If a fitted endpoint is used according to the invention, the entire curve 102 is utilized to determine variations by comparing the entire curve 102 to the standard curve 100. The standard curve 100 is always the reference curve for each endpoint curve 102. The deviations between the two spectrums or curves results in a fitted error where the fitted error identifies changes in the plasma, film, or equipment while the wafers are being processed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An improved semiconductor etching system comprising:

a plasma etching chamber adapted to contain a RF plasma for etching selected portions of a predetermined selected layer of material formed on a semiconductor wafer;

said plasma etching chamber having a window formed therein for viewing light energy at a particular wavelength, which is internally generated and which originates within the RF plasma during the etching of selected portions of a predetermined selected layer of material formed on a semiconductor wafer, which particular internally generated wavelength corresponds to the selected layer of material formed on a semiconductor wafer;

a wavelength detector which detects and monitors the intensity of the particular wavelength internally generated and originated within the RF plasma during the etching of selected portions of the predetermined selected layer of material formed on the semiconductor wafer, said detector providing an output signal proportional to the intensity of the particular wavelength which is internally generated and originated within the RF plasma;

a wavelength sampler which periodically samples the output signal of said wavelength detector to provide a series of stepped output sample pulses;

an A/D converter for converting the series of stepped output sample pulses to a series of multi-bit digital output code words, where each of the code words corresponds to one of the stepped output sample pulses;

a processor including:
an input terminal for receiving the series of multi-bit digital output code words;
an endpoint detector for determining if one of the digital output code word has reached a predetermined endpoint level and for generating a control signal to stop etching of a wafer;
a standard reference-curve generator for generating a standard reference endpoint curve corresponding to standard etching of a standard reference wafer;
a curve generator for mathematically generating a current endpoint curve from the series of multi-bit digital code words for a wafer being etched;
a normalizer for normalizing the current endpoint curve with respect to the standard endpoint curve and for providing a normalized current endpoint curve;
a comparator for fitting and comparing the normalized current endpoint curve to the standard reference endpoint curve; and
wherein the comparator includes a generator for generating a quality index number for the wafer, where the quality index number corresponds to the cumulative area between the normalized current endpoint curve and the standard reference endpoint curve.

2. The improved system of claim 1 including a store for storing a plurality of quality index number, wherein each of said plurality of index number is associated with a previously etched wafer.

3. The improved system of claim 1 including an alarm which is triggered when a quality index number for one of said plurality of quality index numbers exceeds a predetermined value.

4. An improved processor for a semiconductor etching system, comprising:

an endpoint detector which receives a series of multi-bit digital output code words corresponding to samples of the intensity of a particular wavelength generated during etching of a selected layer of material formed on a semiconductor wafer;

wherein the endpoint detector determines if one of the digital output code word has reached a predetermined endpoint level and wherein the endpoint detector generates a control signal to stop etching of the wafer;

a standard reference-curve generator for generating a standard reference endpoint curve corresponding to standard etching of a standard reference wafer;

a curve generator for mathematically generating a current endpoint curve from the series of multi-bit digital code words for a wafer being etched;

a normalizer for normalizing the current endpoint curve generated from the series of multi-bit digital code words for a wafer being etched with respect to the standard endpoint curve and for providing a normalized current reference endpoint curve;

a comparator for fitting and comparing the normalized current endpoint curve to the standard reference endpoint curve; and wherein the comparator includes a generator for generating a quality index number for the wafer, where the quality index number corresponds to the cumulative area between the normalized current endpoint curve and the standard endpoint curve.

5. The improved system of claim 4 including a store for storing a plurality of quality index number, wherein each of said plurality of index number is associated with a previously etched wafer.

6. The improved processor of claim 4 including an alarm which is triggered when a quality index number for one of said plurality of quality index numbers exceeds a predetermined value.

* * * * *